United States Patent [19]
Ziegler et al.

[11] Patent Number: 4,580,245
[45] Date of Patent: Apr. 1, 1986

[54] COMPLEMENTARY METAL OXIDE SEMICONDUCTOR DUAL PORT RANDOM ACCESS MEMORY CELL

[75] Inventors: Daniel H. Ziegler, Brooklyn Center; Donald F. Fier, Eagan, both of Minn.

[73] Assignee: Sperry Corporation, New York, N.Y.

[21] Appl. No.: 518,166

[22] Filed: Jul. 28, 1983

[51] Int. Cl.$^4$ ............................................. G11C 11/00
[52] U.S. Cl. ..................................... 365/154; 365/190
[58] Field of Search ............... 365/149, 154, 189, 190, 365/230

[56] References Cited

U.S. PATENT DOCUMENTS

| | | | |
|---|---|---|---|
| 4,125,877 | 11/1978 | Reinert | 365/190 |
| 4,287,575 | 9/1981 | Eardley et al. | 365/154 X |
| 4,447,891 | 5/1984 | Kadota | 365/154 |

OTHER PUBLICATIONS

L. M. Arzubi, "Two-Device Storage Cell", IBM Technical Disclosure Bulletin, vol. 18, No. 3, Aug. 1975, pp. 649-650.

Primary Examiner—Joseph A. Popek
Attorney, Agent, or Firm—William C. Fuess; Glenn W. Bowen

[57] ABSTRACT

Implemented as a monolithic integrated circuit in CMOS technology, consisting of two two-transistor inverters cross-coupled to form a four-transistor flip-flop memory cell plus an A port NMOS gating transistor connected to one side of the flip-flop and a B port NMOS transistor connected to the other side of the flip-flop. Each A port and B port gating transistor is respectively independently gated by an A port word line and a B port word line addressing signals to conduct the stored contents of the flip-flop respectively to an A port bit line or a B port bit line. The data signal upon each A port bit line and B port bit line is respectively independently gated through respective NMOS transistors by respective A port column address line and B port column address line addressing signals to next be individually compared, in a complementary sense, to a set reference voltage in a respective A port sense amplifier and B port sense amplifier. Reading from either or both the A and B ports is totally independent without conflict. Bit lines are preferably pulled up to the supply voltage. The sense line inputs to the A and B port sense amplifiers are also preferably pulled up to the supply voltage. Writing is by application of equal simultaneous addressing signals on both A and B ports plus the write enabled gating of complementary write data signals, representing the binary quantity to be stored, to each side of the flip-flop memory cell.

13 Claims, 2 Drawing Figures

COMPLEMENTARY METAL OXIDE SEMICONDUCTOR DUAL PORT RANDOM ACCESS MEMORY CELL

BACKGROUND OF THE INVENTION

The present invention generally relates to digital electronic dual port random access memory cells, and more specifically relates to a 6-transistor complementary metal oxide semiconductor implementation thereof such dual port random access memory cells.

Dual port random access to a memory means that a random access memory has two independent data and address paths for access to each memory cell. Ths duality allows the accessing of the memory cell by two different paths simultaneously. Since each access port is independent of the other, both ports can be operated at the same or (asynchronously) at different data rates. One utility of such a dual port random access memory (dual port RAM) is that it enables data to be passed between asynchronous microprocessors without establishing a handshake model such as slows down the faster processor. With the dual port RAM device the faster processor can store, through a first "A" port, data into the dual port RAM, where such data can later be accessed through a second "B" port by a slower processor operating at a slower rate. Dual port RAM's are also useful as a first-in, first-out (FIFO) memories wherein the dual port RAM is a storage element often implemented in using gate array logic.

A prior art example of the implementation of a dual port RAM in transistor-transistor logic is represented by the Advanced Micro Devices AM 2903 microprocessor device, available from Advanced Micro Devices. Another prior art implementation, a dual port end-channel MOS random-access-memory chip of Bell Laboratories, Allentown, Pa. is described in the Oct. 6, 1982 issued of ELECTRONICS Magazine at page 47. Both these prior art references generally discuss the logical characteristics, and the manner of addressing and reading and writing, a dual port RAM.

A prior art implementation of a complementary metal oxide semiconductor technology, dual port random access memory, such as is the subject of applicants' invention, is taught in the paper CMOS DUAL PORT RAM MASTERSLICE by Stephen Glen Bowers of the Storage Technology Corporation appearing in the proceedings of the 1982 CUSTOM INTEGRATED CIRCUITS CONFERENCE of the IEEE at pages 311-314. The implementation presented is a combination of a CMOS 128×9 dual port static ram, 586 2-input gate equivalent blocks of CMOS logic gate array, 96 I/O pads and 8 power pads implemented as a master slice in 3 micron poly gate, oxide isolated complementary metal oxide semiconductor process. Of particular interest to the present invention, the memory cell which is the building block of the dual port RAM is comprised of 8 transistors. Additionally, the 8 transistor dual port implementation of the RAM cell will demonstrate unequal capacitance, and resultantly unequal signals, to each of the two, A and B, port bit lines dependent upon whether a single one, or both, of such two ports are being read at the same time. This dual, and/or asynchronous A and B port readings is not prohibited in the prior art embodiment, however, the bit line signals sensed at the outputs of the cell will be variant dependent upon whether such cell is being read at one only, or at both, ports. Finally, the prior art cell will prove to exhibit much more parasitic capacitance on the bit lines connected thereto than the dual port RAM cell of the present invention.

SUMMARY OF THE INVENTION

The present invention is a 6-transistor dual port random access memory cell implementatable in complementary metal oxide semiconductor technology. The cell is implementatable of transistors of like feature size to prior art implementations, thereby offering a 25 percent improvement in density from the 8-transistor implementation of the prior art. The dense nature of the 6-transistor dual port RAM cell of the present invention will result in less parasitic capacitance upon the bit lines of both of the A and B ports than the prior art 8-transistor cell. If such reduction in parasitic capacitance is considered, then the 6-transistor cell of the present invention will be seen to offer a signal level, the resultant noise immunity, to the bit line sense amplifiers which are commensurate with the signal level and noise immunity of the prior art, 8-transistor, implementation. Finally, the 6-transistor dual port RAM cell of the present invention will show no change in the signals, nor the impedance characteristics, seen by each of the two sense amplifiers as are respectively associated with the two bit lines regardless of whether the cell is being read from the first (A), the second (B), or both the first and the second (A and B) ports at the same time. In other words, the reading of the dual port RAM cell is non-conflicting.

The replicatable 6-transistor dual port RAM cell of the present invention is composed of two 2-transistor inverters cross-coupled to form a 4-transistor flip-flop core memory cell. Each of the first (set) and complementary second (clear) side signal outputs of such 4-transistor flip-flop core memory cell is gated by a transistor, each of which two gating transistors is respectively gated by the signals on two independent word lines. The total transistors within the replicated dual port RAM cell thusly number 6. The word line signal gated output of one (word) selected such cell is further gated by a transistor responsive to signals upon a column address line. The twice-gated signal from the 4-transistor flip-flop core memory cell—gated by a first transistor responsive to signals upon a word line, and by a second transistor responsive to signals upon a column address line—is compared to a voltage reference signal in a differential amplifier in order that the contents of such core memory cell, as represented by such gated output signal may be determined. When this structure for twice gating, and for differentially comparing to a voltage reference, is repeated for the output signals of both the first (set) and second (clear) sides of a 4-transistor flip-flop memory cell, then such cell evidences dual ports (A and B). The gated signal received at each of the differential, or sense, amplifiers is voltage biased, or pulled up, in order that the voltage detected by each such amplifier—when the dual port RAM cell is not respectively enabled i.e. is deselected (via such dual gating) to be read to the amplifier—will be High.

The 6-transistor dual port RAM cell of the present invention is written by the application of a first write data signal to that second transistor (gated by the A port column address line) connecting to the first (A) signal port, plus by the simultaneous application of a second write data signal, at a level which represents the binary logical complement of the data represented by such first write data signal, to that second transistor (gated by the B port column address line) connecting to the second (B) signal port. Both the first and the second write data signals are gated to be so applied by transistors responsive to a common control signal, called a write enable signal. Meanwhile, the identical column address line signal is impressed the column address lines of both the A and B ports. Likewise, the identical word line signal is impressed upon the word lines of both the A and B ports. Resultantly to all such signals, the first write data signal is addressably enabled to be connected a first (set) side of the 4-transistor flip-flop core memory cell by the addressing signals upon the A port column address line plus the A port word line, and the complementary second write data signal is addressably enabled to be connected to the second (clear side of the 4-transistor flip-flop core memory cell by the addressing signals upon the B port column address line plus the B port word line. Resultantly to such connections, the addressed 4-transistor flip-flop core memory cell will assume the inputted write data value.

Correspondingly, it is a first object of the present invention that a replicatable dual port RAM memory cell should be realizable, preferably in complementary metal oxide semiconductor technology, with 6 (only) transistors. This effectuates a 25 percent improvement in numbers of components over the prior art 8-transistor dual port RAM cell realization.

It is a second object of the present invention that the reading of the first (A) port and the second (B) port of the 6-transistor dual port RAM cell may transpire in an asynchronous, which asynchrony includes the possibility of simultaneity, and totally independent manner. By such independence it is meant that the electrical characteristics, and sense signal waveforms, resultant from the reading of data through one port, the first (A) or the second (B) port, will not be appreciably different dependent upon whether activity is transpiring or not transpiring upon the other port.

It is a third object of the present invention that when either, or both, of the ports of the dual port RAM cell are not gateably enabled for reading via the respective word line address line signals and column address line signals, then the signal output from the A port sense amplifier will be High, corresponding to binary one; and the signal output from the B port sense amplifier will be Low, corresponding to binary zero. This object is realized through lower bit line pull up transistors on each, A port and B port, bit line.

It is a fourth objective of the present invention that the dual port RAM cell may be written with data without either additional, nor different, control lines other than those associated with the reading process. This object is realized in a write operation which simultaneously controls the word lines and column address lines of both the A and B ports while emplacing data in complementary form upon both the A and the B bit lines.

It is a fifth object of the present inventon that signal magnitudes, resultant noise immunities, and the general speed of operation of the 6-transistor dual port RAM cell shall be comparable with prior art implementations. When the differential data signal voltages applied to the sense amplifiers are established equal to those obtainable in the prior art 8-transistor implementation of the dual port RAM cell, the preferred embodiment of the present invention will be seen to be possessed of less parasitic capacitance, and is thusly faster. In other words, it is the fifth object that neither speed, feature size, nor parasitic capcitance of a dual port RAM memory cell should be adversely affected, comparably to prior art structures, in order to obtain the operation of a dual port RAM memory cell in the 6-transistor configuration of the present invention.

DESCRIPTION OF THE PREFERRED EMBODIMENT

The present invention is a dual port random access memory cell implemented in complementary metal oxide semiconductor technology as a static RAM. Dual port means that the random access memory (RAM) has two independent address and data paths for access of each memory cell. This dual access allows the accessing of two different memory words asynchronously, and potentially simultaneously. Since read accesses occurring on each port are independent of read accesses occurring on the other port, each port may be operated at the same or at different data rates.

The utility of such a dual port random access memory is primarily in distributed processing computer systems, wherein processing elements, predominantly microprocessors, need share a read/write memory. A dual port memory, besides, of course, storing data locally, does also enable two devices to transfer data to one another fast and efficiently through the memory store, without the delay inherent in handshaking transfers. When data is passed between asynchronous processors in a handshaking mode, the transfer ends up slowing down the faster processor. With a dual port random access memory device, the faster processor will simply transfer data into the dual port random access memory where it can then be accessed by the slower processor operating at its own rate. Such asynchronous operation of a dual port random access memory cell may be accomplished by blocking circuitry that splits the memory cycle into two user-transparent internal cycles, one for each port. If an access request comes in on port B while port A is active, for example, the port B address, the port B input data, and the write enable information on port B is simply latched to a buffer where it waits to be serviced until the A portion of the cycle is complete. The teaching of a master contention circuit, performing arbitration between requests arriving simultaneously upon two ports, is not the subject of the present invention. However, the random access memory cell of the present invention presents no intrinsic limitations as to the time or times of reading from one port versus the time or times of reading from the other port. In other words, there is no recharge, nor latency, in the cell dependent upon activity transpiring, or recently transpiring, on the other port.

Figure 1:
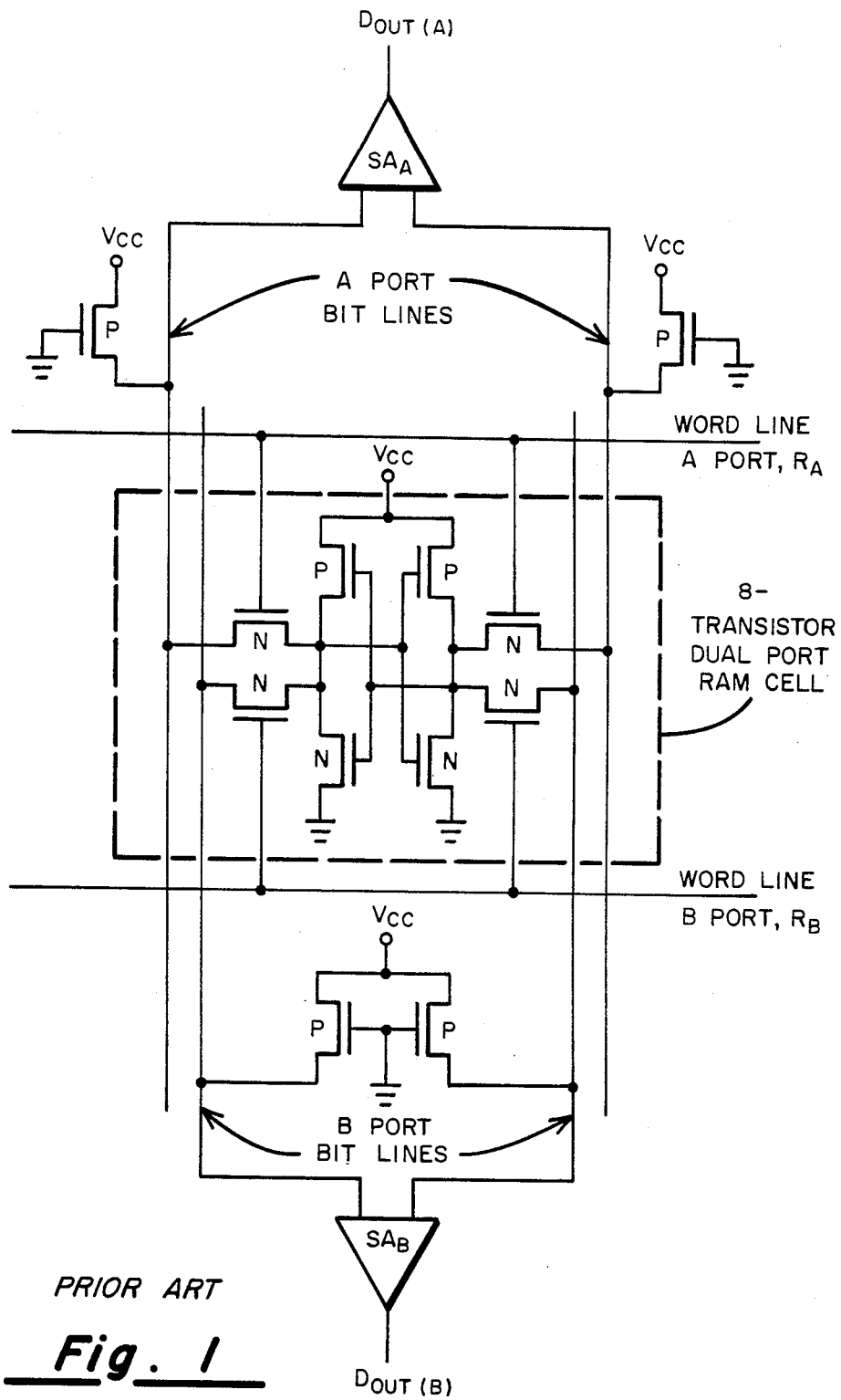
FIG. 1 shows a prior art complementary metal oxide semiconductor dual port random access memory cell plus the connections, and circuit elements, for the reading and writing thereof.

A prior art dual port CMOS static RAM is shown in FIG. 1. This figure is derived from the article CMOS DUAL PORT RAM MASTERSLICE by Steven Glen Bowers of Storage Technology Corporation, Louisville, Colo. 80027 appearing in the proceedings of the 1982 Custom Integrated Circuits Conference of the IEEE at page 311. The dual port RAM cell shown in FIG. 1 is combined with a CMOS logic gate array to form a 128×9 CMOS dual port static RAM master slice on a die of size 228 mils. (5.8 mm)×238 mils. (6.05 mm). Of this area the dual port RAM occupies an area of 124 mils. (3.2 mm)×96 mils. (2.4 mm) when fabricated with a 3 micron poly gate, oxide isolated CMOS process. Additional basic process and design characteristics are given in the Bowers article. Additionally, the block diagram of the surrounding control structure of a dual port RAM is shown in FIG. 3 of such article, such logics surrounding a memory array as are equivalent to those utilized for applicants' device shown in FIG. 2, and which such logics for the addressable reading and writing of memory cells are common in the art.

Of pertinence to the present invention, prior art FIG. I shows a memory cell which is a conventional CMOS cross-coupled inverter cell (consists of two P-type and N-type transistor pairs) attached to two independent sets of differential bit lines (A port bit lines and B port bit lines) by 4 NMOS transfer gates (4 transistors). The entire cell thusly consists of 8 transistors, and is called 8-TRANSISTOR DUAL PORT RAM CELL. The A port bit lines and the B port bit lines are continually charged to supply voltage $V_{CC}$ by PMOS load devices consisting of two P-type transistors each. During a read cycle on the A port, WORD LINE A PORT, $R_A$ assumes a logically High condition; during a read operation on the B port, WORD LINE B PORT, $R_B$ assumes a logically High signal condition. During a read cycle on either port, one of the bit lines on that port is pulled below voltage $V_{CC}$ to a voltage determined by the ratio of the pull up of PMOS bit line load and the pull down through the NMOS transfer gate and the NMOS inverter device. This voltage is typically 4 volts. This voltage between the bit line, of differing polarity dependent upon whether a logical 0 or a logical 1 was stored within the CMOS cross-coupled inverter cell, is sensed in sense amplifier $SA_A$ to be provided as data signal $D_{OUT(A)}$ for the A port, and is sensed in sense amplifier $SA_B$ to be provided as data signal $D_{OUT(B)}$ for the B port. The typical construction of a sense amplifier is shown in FIG. 5 of the prior art Bowers paper and is routine in the art.

The following aspects of the prior art CMOS dual port RAM cell shown in FIG. 1 should be observed. First, the replicable structure of the dual port RAM cell obviously consists of 8 transistors. Secondly, the differential signal seen between the bit lines of either port (the A PORT BIT LINES or the B PORT BIT LINES) will be different dependent upon whether a single one, or both, of such A and B ports are being read at the same time. As previously stated, the voltage between the bit lines is determined by the ratio of the pull up of the PMOS bit line load and the pull down through the NMOS transfer gate and NMOS inverter devices. Dependent upon whether a single one, or both, of the ports is being simultaneously addressed, then one of the NMOS inverter devices will sink a differential amount of current to ground, and consequently the sensed voltage signal levels upon the bit lines will be differential. Finally, the large number (8) of active elements contribute a good deal of parasitic capacitance, particularly to the bit lines. It may be noted that the total bit lines (2) of each port contact two NMOS transfer gates and associated parasitic capacitance at each of the 8-TRANSISTOR DUAL PORT RAM CELLS. Increased parasitic capacitance on the bit lines decreases the performance of the random access memory cells.

Figure 2:
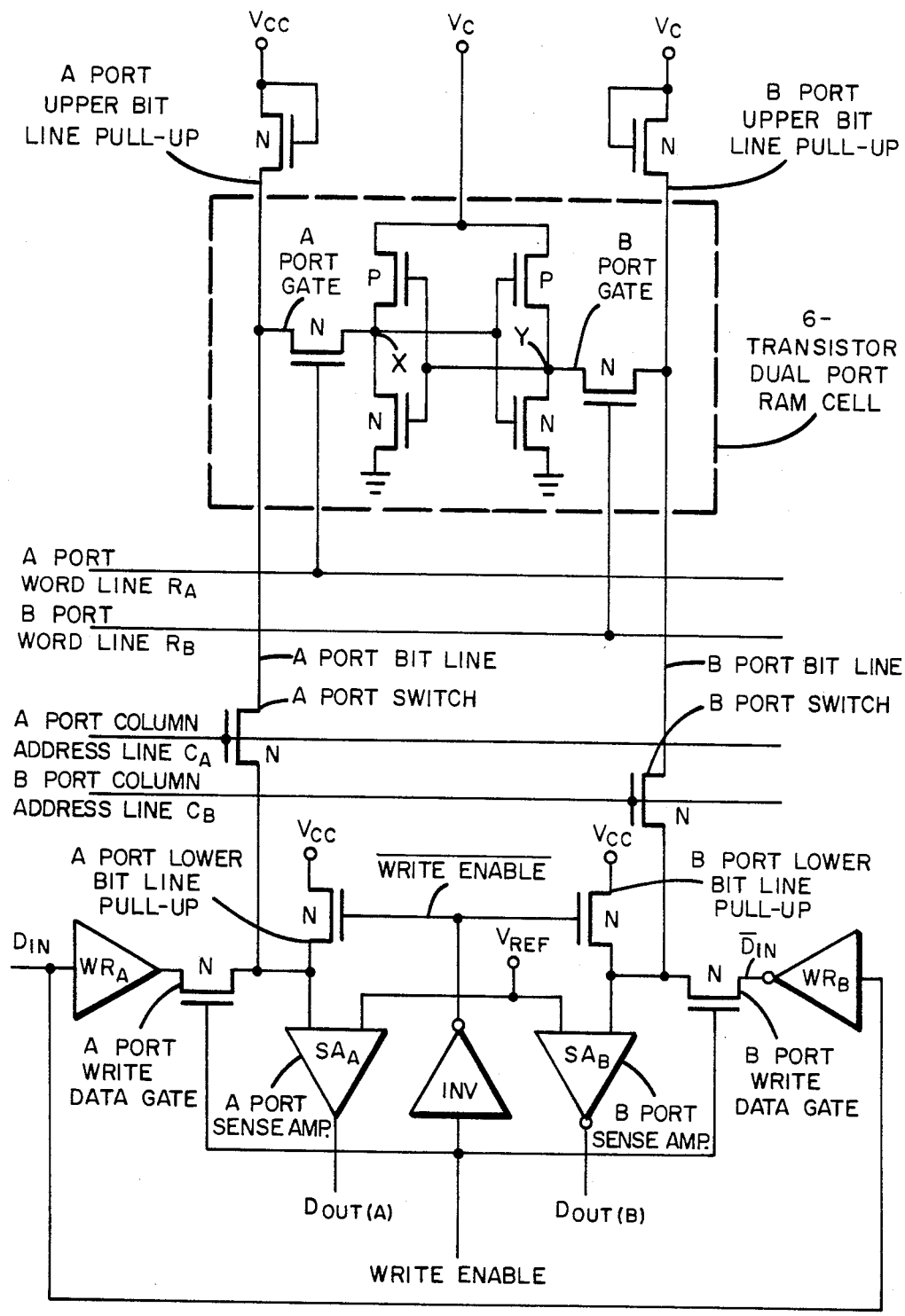
FIG. 2 shows the present invention of a 6-transistor complementary metal oxide semiconductor dual port random access memory cell plus the connections, and circuit elements, for the reading and writing of data thereto.

The present invention of a complementary metal oxide semiconductor dual port random access memory cell is shown in FIG. 2. The memory cell, called a 6-TRANSISTOR DUAL PORT RAM CELL in FIG. 2, is independently addressed upon a first, A port by signals upon a first word line, the A PORT WORD LINE $R_A$ and upon a first column address line, line A port column address line $C_A$. It is additionally independently addressed upon a second, B port by signals upon a second word line, line B port word line $R_B$, and a second column address line, line B port column address line $C_B$. The 6-TRANSISTOR DUAL PORT RAM CELL independently addressable upon a first and a second, A and B, side, respectively connects on each such side to a first bit line, the A port bit line and a second bit line, B port bit line. The bit lines, individually, serve as the means by which the data contents of the 6-TRANSISTOR DUAL PORT RAM CELL may be read, and both such bit lines, collectively, serve as the means by which data may be written to the 6-TRANSISTOR DUAL PORT RAM CELL.

Continuing in FIG. 2, the 6-TRANSISTOR DUAL PORT RAM CELL proper first consists of two 2-transistor MOS inverters cross-coupled to form a 4-transistor flip-flop memory cell. Each such inverter may be observed as a PMOS transistor series connected with a NMOS transistor between a supply voltage $V_{CC}$, nominally 5 v.d.c. and ground. The 6-TRANSISTOR DUAL PORT RAM CELL also consists of a first, A side gate, the A PORT GATE which consists of an NMOS transistor. Finally, the 6-TRANSISTOR DUAL PORT RAM CELL also consists of a second, B side gate, the B PORT GATE also consisting of an NMOS transistor. It is possible to reverse the entire polarity, or sense of the 6-TRANSISTOR DUAL PORT RAM CELL (with attendant changes to the polarity of the connective circuitry the function of which will be next discussed). In such a complementary construction, the supply voltage $V_{CC}$ would be negative, nominally −5 v.d.c. and all NMOS transistors would become PMOS types and vice versa. The embodiment illustrated in FIG. 2, is however, the preferred embodiment for implementation in MOS semiconductor technology because a NMOS type transistor exhibits less conducting (turned-on) resistance for the same substrate area than does a PMOS transistor by a factor of approximately times 3. Therefore, the A PORT GATE and B PORT GATE are preferably implemented from NMOS transistor types, although they need not be so implemented if the sense of the entire circuit shown in FIG. 2 is reversed.

Continuing in FIG. 2 the manner by which the present invention of a dual port random access memory cell may be read is as follows. The provision of an A side address, via A PORT WORD LINE $R_A$ and A PORT COLUMN ADDRESS LINE $C_A$ to the 6-TRANSISTOR DUAL PORT RAM CELL is totally asynchronous with, and may be simultaneous with, the provision of a B side address via B PORT WORD LINE $R_B$ and B PORT COLUMN ADDRESS LINE $C_B$. Considering the read operation by reference to the A port, the occurrence of a logical High signal on the A PORT WORD LINE $R_A$ will enable the A PORT GATE allowing the signal representing the first side storage of the 4-transistor flip-flop memory cell, the signal at point X shown in FIG. 2, to be transferred to the A PORT BIT LINE. When the signal on the A PORT COLUMN ADDRESS LINE $C_A$ likewise goes High, completing the addressing of an individual 6-TRANSISTOR DUAL PORT RAM CELL, then the signal on the A PORT BIT LINE will be gated in the A PORT SWITCH to the A PORT SENSE AMPLIFIER $SA_A$ wherein it is sensed against a reference voltage $V_{REF}$ and amplified to full power supply voltage levels. The signal line between the A PORT SWITCH and the A PORT SENSE AMPLIFIER may be called a sense line (although it is not labeled in FIG. 2) because it is upon this line that the signal which arose in the storage of the 4-transistor is sensed by the A PORT SENSE AMPLIFIER $SA_A$. The A PORT GATE contained within each unique one(s) of the 6-TRANSISTOR DUAL-PORT RAM CELL is responsive to a High signal upon the A PORT WORD LINE $R_A$ to gate the signal stored in the 4-transistor flip-flop memory cell to the A PORT BIT LINE. Then the A PORT SWITCH is responsive to a High signal upon the A PORT COLUMN ADDRESS LINE $C_A$ to further gate the signal upon the A PORT BIT LINE to the sense line which is input to the A PORT SENSE AMPLIFIER $SA_A$. The A PORT SWITCH is an NMOS transistor. The voltage reference $V_{REF}$ is nominally +2.85 v.d.c. which gives good signal discrimination and noise immunity when the present circuit is implemented in monolithic very large scale integrated circuitry operating under a supply voltage $V_{CC}$ of +5 v.d.c. The output signal of the A PORT SENSE AMPLIFIER $SA_A$ is the data output signal $D_{OUT(A)}$. Identically, and totally independently on the B port, if the signals on the B PORT WORD LINE $R_B$ and B PORT COLUMN ADDRESS LINE $C_B$ go High, then the signal level at the second side of the 4-transistor flip-flop memory cell embedded within the 6-TRANSISTOR DUAL PORT RAM CELL, that signal occurring at point Y shown in FIG. 2, is gated through the B PORT GATE to the B PORT BIT LINE and thence through the B PORT SWITCH to the B PORT SENSE AMPLIFIER. The B PORT SWITCH is an NMOS transistor. Therein the B PORT SENSE AMPLIFIER $SA_B$ it is compared with the reference voltage $V_{REF}$, amplified, inverted and provided as the B port data output signal $D_{OUT(B)}$. Note that only the B PORT SENSE AMPLIFIER $SA_B$ is inverting.

Continuing in FIG. 2, it may be noted that the manner, or sense, by which the signal on A PORT BIT LINE compared to reference voltage $V_{REF}$, nominally 2.85 v.d.c., in the A PORT SENSE AMPLIFIER $SA_A$ is opposite to the comparison of the signal on the B PORT BIT LINE to reference voltage $V_{REF}$ in the B PORT SENSE AMPLIFIER $SB_B$. This is because the signal carried on the B PORT SENSE LINE, being derived from point Y which is the clear side of DUAL PORT RAM CELL, is really that signal which corresponds to the complement of the stored data contents. In other words, if the 4-transistor flip-flop memory cell is set, or storing a binary one, then the High signal level at point X may be addressably transferred to the A PORT SENSE AMPLIFIER $SA_A$ in generation of High signal $D_{OUT(A)}$. Similarly, the Low signal at point Y as (alternatively and independently) addressably transferred to the B PORT SENSE AMPLIFIER $SA_B$ will cause the generation of High signal $D_{OUT(B)}$.

Continuing in FIG. 2, the A PORT BIT LINE is pulled up, or aided in line charging in development of a High signal, by connections to supply voltage $V_{CC}$, nominally 5 v.d.c., by the respective A PORT UPPER BIT LINE PULL UP and the A PORT LOWER BIT LINE PULL UP. The A PORT UPPER BIT LINE PULL UP, always on and enabled, is an NMOS transistor which, when connected to the supply voltage $V_{CC}$, pulls up the A PORT BIT LINE to approximately 3.85 v.d.c. If the 6-TRANSISTOR DUAL PORT RAM CELL is not addressed, or deselected, the A PORT UPPER BIT LINE PULL UP is responsible for pulling up the A PORT BIT LINE in voltage on the side of the A PORT SWITCH (which is off, or open) upon the 6-TRANSISTOR DUAL PORT RAM CELL is situated. The A PORT LOWER BIT LINE PULL UP accomplishes the same purpose on the other side of the A PORT SWITCH. It is a NMOS transistor connected to supply voltage $V_{CC}$ and enabled by $\overline{\text{WRITE ENABLE}}$, which is the inversion of the signal WRITE ENABLE which is illustrated to be obtainable in an INVERTER. Whenever a write operation is performed, signal $\overline{\text{WRITE ENABLE}}$ is Low, then the A PORT LOWER BIT LINE PULL UP is turned off, conserving current which would otherwise be expended in overcoming such A PORT LOWER BIT LINE PULL UP. Both the B PORT UPPER BIT LINE PULL UP and the B PORT LOWER BIT LINE PULL UP function in an equivalent manner. Usage of the A PORT BIT LINE PULL UPS and B PORT BIT LINE PULL UPS are not essential, but improves the time response of the circuit when a High signal (representative of a logical one at point X or a logical zero at point Y) is gated from either side of the 6-TRANSISTOR DUAL PORT RAM CELL without significantly detrimentally effecting the response of the circuit when, through current sinking to ground occurring through series NMOS transistors, a Low signal is alternatively developed upon the A PORT BIT LINE OR B PORT BIT LINE (which Low signal is respectively representative of a logical zero and a logical one upon such bit lines). In other words, the supplemental line charging current provided by any and all the optional pull ups is readily sunk to ground within the 4-transistor flip-flop memory cell port of the 6-TRANSISTOR DUAL PORT RAM CELL.

Notably, in the reading of the 6-TRANSISTOR DUAL PORT RAM CELL shown in FIG. 2 no differential capacitance will be seen by the A PORT BIT LINE or the B PORT BIT LINE dependent upon the activities, potentially simultaneous, upon either. The respective signals received at A PORT SENSE AMPLIFIER $SA_A$ and B PORT SENSE AMPLIFIER $SA_B$ will not be differential dependent upon whether one, or both, the A port and the B port are being simultaneously read. This non-conflicting, non-interfering operation of the dual port random access memory cell of the present invention during read should be compared to the prior art structure shown in FIG. 1, which structure does not exhibit such independence between ports during the read operation.

Continuing in FIG. 2, the operation of the present invention of a dual port random access memory cell for being written with data will next be discussed. During the writing of the 6-TRANSISTOR DUAL PORT RAM CELL such cell will be identically, and simultaneously, addressed through and upon both the A and B ports. The external circuitry (not shown) addressing such 6-TRANSISTOR DUAL PORT RAM CELL is simply designed so that during a write operation both the A and B address decoders shall be supplied with the same identical address. In other words, in the write addressing a particular 6-TRANSISTOR DUAL PORT RAM CELL, a High signal on the A PORT WORD LINE $R_A$ will identically occur with a High signal on the B PORT WORD LINE $R_B$ and a High signal on the A PORT COLUMN ADDRESS LINE $C_A$ will identically occur with a High signal on the B PORT COLUMN ADDRESS LINE $C_B$.

Continuing in FIG. 2, during the writing of the 6-TRANSISTOR DUAL PORT RAM CELL, the High signal WRITE ENABLE is applied to the A PORT WRITE DATA GATE, the B PORT WRITE DATA GATE, both of which write data gates are NMOS transistors. The inversion of the High signal WRITE ENABLE in the INVERTER produces the Low signal $\overline{\text{WRITE ENABLE}}$ which shuts off both the A PORT LOWER BIT LINE PULL UP and the B PORT BIT LINE PULL UP, both of which pull ups are NMOS transistors. Meanwhile, the normal form write data signal $D_{IN}$ is driven by the write data amplifier $WR_A$ while the inverted write data signal $\overline{D}_{IN}$ is driven by the inverting the write data amplifier $WR_B$. If a logical "1" is to be written, the normal form data input signal $D_{IN}$ will be be at a High level while the inverted form data input signal $\overline{D}_{IN}$ will be at a Low level. The opposite is true for the writing of a logical "0". The A and B side write data amplifiers $WR_A$ and $WR_B$, as are respectively connected to the A PORT BIT LINE and the B PORT BIT LINE via the A PORT WRITE DATA GATE and B PORT WRITE DATA GATE, provide sufficient current source (or sink) capability to overcome all other current sinks (or souces) within the 6-TRANSISTOR DUAL PORT RAM CELL. The two write data signals of opposite polarity, when addressably connected to the 6-TRANSISTOR DUAL PORT RAM CELL through the identical High signal condition on the A PORT COLUMN ADDRESS LINE $C_A$ and B PORT COLUMN ADDRESS LINE $C_B$ in conjunction with the identical High signal on the A PORT WORD LINE $R_A$ and B PORT WORD LINE $R_B$, will enable the setting (or clearing as the case may be) of the 4-transistor flip-flop memory cell within the 6-TRANSISTOR DUAL PORT RAM CELL. At the conclusion of write operation, the signal WRITE ENABLE will go Low disconnecting any further application of write data signals while the simultaneous application of a uniform signal to the A PORT COLUMN ADDRESS LINE $C_A$ and B PORT COLUMN ADDRESS LINE $C_B$, as well as the application of another uniform signal to the A PORT WORD LINE $R_A$ and B PORT WORD LINE $R_B$ will cease, freeing these address lines for independent (A and B port) utilization during read operations. The A PORT LOWER BIT LINE PULL UP and the B PORT LOWER BIT LINE PULL UP are also reenabled to provide current.

The replicatable 6-TRANSISTOR DUAL PORT RAM CELL shown in FIG. 2 may be fabricated as monolithic integrated circuitry in a polygate, oxide isolated complementary metal oxide semiconductor process. Th preferred process utilized an p-type substrate with an implanted n-type well. A two layer metal interconnect system is used for interconnection to the 6-TRANSISTOR DUAL PORT RAM CELL. Design and layout rules are perferably based upon the direct step on wafer photolithographic process. When so fabricated, the preferred device characteristics are as follows. The feature size (channel length) of the PMOS transistors will be 1.75 micrometers and the NMOS transistors will be 1.5 micrometers. The gate oxide thickness is approximately 250 angstroms. The NMOS VT equals 0.85 volts, the PMOS VT equals 31 0.85 volts, and the field VT(s) is(are) greater than 10 volts. The supply voltage $V_{CC}$ is nominally $5\pm0.5$ volts d.c. The reference voltage $V_{REF}$ is nominally 2.85 plus or minus 0.04 volts d.c. The first metal width is nominally 3.5 micrometers, the second metal width is nominally 5 micrometers, and the via size is nominally 2 micrometers.

While the present invention of a 6-TRANSISTOR DUAL PORT RAM CELL has been described with referenct to the preferred embodiment, it is to be noted that variations may suggest themselves to those of skill in the art upon the reading of the present specification. It is therefore asserted that the spirt and the scope of the present invention must be interpreted in a broad sense from the following claims.

What is claimed is:

1. A dual port random access memory cell addressed upon a first, A, port by signals upon a first word line and a first column address line to read stored data from said cell as a signal upon a first bit line, and also addressed upon a second, B, port by signals upon a second word line and a second column address line to read said stored data from said cell as a signal upon a second bit line, said dual port random access memory cell comprising:

two two-transistor inverters cross-coupled to form a four-transistor flip-flop memory cell;

a fifth transistor, responsive to a first word line addressing signal upon a first word line, for controllably gating a first signal level from a first side of said flip-flop to a first bit line;

a sixth transistor, responsive to a second word line addressing signal upon a second word line independent of said first word line, for controllably gating a second signal level from a second side of said flip-flop to a second bit line independent of said first bit line;

a first sensing means, responsive to a signal upon a first sense line, for sensing the stored contents of a memory cell carried as a first signal upon said first sense line;

second sensing means, responsive to a signal upon a second sense line, for sensing the stored contents of a memory cell carried as a second signal upon said second sense line;

a first switching means, responsive to a first column addressing signal upon a first column address line, for gating said first signal level upon said first bit line to said first sensing means as said first signal upon said first sense line; and second switching means, responsive to a second column addressing signal upon a second column address line independent of said first column address line, for gating said second signal level upon said second bit line to said second sensing means as said second signal upon said second sense line;

wherein said four-transistor flip-flop memory cell may be addressed at a first, A, port by a signal upon said first word line and also by a signal upon said first column address line which signals cause said first signal level from said first side of said flip-flop to be gated through said fifth transistor to said first bit line, and then through said first switching means to said first sensing means;

wherein said four-transistor flip-flop memory cell may be addressed at a second, B, port by a signal upon said second word line and also by a signal upon said second column address line which signals cause said second signal level from said second side of said flip-flop to be gated through said sixth transistor to said second bit line, and then through said second switching means to said second sensing means;

whereby said four-transistor flip-flop memory cell is addressable at each of said first and said second ports, and is independently addressable at each of said first and said second ports.

2. The dual port random access memory cell of claim 1 which further comprises:

a first pull up voltage biasing means for maintaining said first bit line at a signal level representing binary "one" data when said fifth transistor, responsive to said first word line addressing signal upon said first word line, does not gate said first signal level upon said first side of said flip-flop to said first bit line, but which first pull up voltage biasing means is insufficient to preclude that a signal level representing binary "zero" data may occur upon said first bit line when said fifth transistor, responsively to said first word line addressing signal upon said first word line, does gate said first signal level upon said first side of said flip-flop to said first bit line; and second pull up voltage biasing means for maintaining said second bit line at a signal level representing binary "one" data when said sixth transistor, responsive to said second word line addressing signal upon said second word line, does not gate said second signal level upon said second side of said flip-flop to said second bit line, but which second pull up voltage biasing means is insufficient to preclude that a signal level representing binary "zero" data may occur upon said second bit line when said sixth transistor, responsively to said second word line addressing signal upon said second word line, does gate said second signal level upon said second side of said flip-flop to said second bit line.

3. The dual port random access memory cell of claim 2 which further comprises:

third pull up voltage biasing means for maintaining said first sense line at a signal level representing binary "one" data when said first switching means, responsive to said first column addressing signal upon said first column address line, does not gate said first signal level upon said first bit line to said first sensing means, but which third pull up voltage biasing means is insufficient to preclude that a signal level representing binary "zero" data may occur upon said first sense line when said first switching means, responsive to said first column addressing signal upon said first column address line, does gate said first signal level upon said first bit line to said first sensing means;

fourth pull up voltage biasing means for maintaining said second sense line at a signal level representing binary "one" data when said second switching means, responsive to said second column addressing signal upon said second column address line, does not gate said second signal level upon said second bit line to said second sensing means, but which fourth pull up voltage biasing means is insufficient to preclude that a signal level representing binary "zero" data may occur upon said second sense line when said second switching means, responsive to said second column addressing signal upon said second column address line, does gate said second signal level upon said second bit line to said second sensing means.

4. The dual port random access memory cell of claim 1 wherein said first sensing means comprises:

differential amplifier sensing means, responsive to a difference between a signal upon a sense line and a first reference voltage level, for sensing the stored contents of any memory cell carried as a signal upon the sense line, and for amplifying said sensed stored contents in order to produce a data output signal; and wherein said second sensing means comprises:

differential amplifier sensing means, responsive to a difference between a second reference voltage level and a signal upon a sense line, for sensing the stored contents of any memory cell carried as a signal upon the sense line, and for amplifying said sensed stored contents in order to produce a data output signal.

5. The dual port random access memory cell of claim 4 wherein said first reference voltage level equals said second reference voltage level.

6. The dual port random access memory cell of claim 1 implemented in Complementary Metal Oxide Semiconductor (CMOS) technology.

7. The dual port random access memoy cell of claim 6 wherein each said two-transistor inverter comprises a series P-type and N-type transistor, wherein said fifth transistor comprises a N-type transistor, wherein said sixth transistor comprises a N-type transistor, wherein said first switching means comprises a N-type transistor, and wherein said second switching means comprises a N-type transistor.

8. The dual port random access memory cell of claim 6 wherein each said two-transistor inverter comprises a P-type transistor, wherein said sixth transistor comprises a P-type transistor, and wherein said first switching means comprises a P-type transistor, and wherein said second switching means comprises a P-type transistor.

9. The dual poart random access memory cell of claim 1 which further comprises:

means for supplying a first input data signal and the complement signal of said first input data signal;

means for supplying a write enablement signal;

first write data gating means responsive to said write enablement signal for gating said first input data signa to said first sense line;

second write data gating means responsive to said write enablement signal for gating said complement signal of said first data signal to said second sense line;

means for supplying a column addressing signal identically to said first column address line and to said second column address line which said column addressing signal does, respectively as said first column addressing signal upon said first column address line and as said second column addressing signal upon said second column address line, respectively enable said first switching means to gate said first input data signal upon said first sense line to said first bit line and enable said second switching means to gate said complement signal of said first data signal upon said second sense line to said second bit line;

means for supplying a word line addressing signal identically to said first word line and to said second word line which said word line addressing signal does, respectively as said first word line addressing signal upon said first word line and as said second word line addressing signal upon said second word line, respectively enable said fifth transistor to gate said first input data signal upon said first bit line to said first side of said flip-flop and said sixth transistor to gate said complement of said first input data signal upon said second bit line to said second side of said flip-flop;

wherein said flip-flop is stored with data responsively to both said first input data signal upon said first side and said complement of said first input data signal upon said second side;

wherein said random access memory cell is uniformly addressed at both ports thereof and is, subject to said first input data signal and said complement of said first input data signal, written with a binary value which is stored within said four-transistor flip-flop memory cell.

10. A method of performing dual asynchronous, and because of being asynchronous being also occasionally simultaneous, addressable references to the data contents of a memory cell through two independent connections to (ports of) said cell, each of which said two connections provides a signal output representing the contents thereof said cell, said method comprising:

first gating, in a first transistor, at a first time, responsive to a first first-type addressing signal called a word addressing signal a first signal output, obtained at a first of said two conenctions to said memory cell, onto a first signal path; and also at said first time second gating, in a second transistor responsive to a first second-type addressing signal called a column addressing signal, said first signal output now upon said first signal path to a first differential sensor; and also at said first time first comparing in said first differential sensor said first signal output and an invariant first reference signal in order by whether said first comparing shows equality or inequality to then derive the binary data contents of said memory cell; also third gating in a third transistor, at a second time asynchronous with said first time, responsive to a second first-type addressing signal (said word addressing signal-type) a second signal output, obtained at a second of said two connections to said memory cell, onto a second signal path; and also at said second time fourth gating in a fourth transistor responsive to a second second-type addressing signal (said column addressing signal-type), said second signal output now upon said second signal path to a second differential sensor; and also at said second time second comparing in said second differential sensor said second signal output and an invariant second reference signal in order by whether said second comparing shows equality or inequality to then derive the binary data contents of said memory cell from said comparing;

whereby said signal outputs representing the contents of said memory cell at each of said two connections to said cell are not specified to be, and need not be, in the same polarity or magnitude;

whereby one only said first output signal is gated by said first first-type and said first second-type addressing signals to said first comparing within said first differential sensor whereas, in asynchronous time, one only said second output signal is gated by said second first-type and said second second-type addressing signals to said second comparing within said second differential sensor;

whereby said memory cell is addressably referencable for the binary data contents thereof asynchronously through a first connection providing a first signal output and through a second connection providing a second signal output.

11. The method of performing dual asynchronous addressable references to a memory cell through two connections to said cell of claim 10 wherein said first signal output is the inverse, or complement, of said second signal output.

12. The method of performing dual asynchronous addressable references to a memory cell through two connections to said cell of claim 10 wherein said invariant first reference signal equals said invariant second reference signal.

13. The method of performing dual asynchronous references of claim 10 further expanded to include the writing of data, represented by a data signal and the complement of said data signal, into said memory cell, said expanded method comprising:

fifth gating in a fifth transistor, at a third time separate from both said first and said second times, responsive to a write enable signal a data signal to said first; differential sensor and also at said third time second gating, in said second transistor responsive to said first second-type addressing signal, that said data signal now at this third time at said first differential sensor further to said first signal path; and also at said third time first gating, in said first trnsistor responsive to said first first-type addressing signal, that said data signal now at this third time upon said first signal path further to said first of said two connections to said memory cell; and also at said third time sixth gating in a sixth transistor responsive to said write enable signal said complement of said data signal to said second differential sensor; and also at said third time fourth gating, in said fourth transistor responsive to said second second-type addressing signal which is now at this third time equal to said first second-type addressing signal, that said complement of said data signal now at this third time at said second differential sensor further to said second signal path; and also at said third time third gating, in said third transistor responsive to said second first-type addressing signal which is now at this third time equal to said first first-type addressing signal, that said complement of said data signal now at this third time upon said second signal path further to said second of said two connections to said memory cell;

wherein the binary data stored within said memory cell will write at this said third time responsive to said data signal applied to said first of said two connections, and responsive to said complement of said data signal applied to said second of said two connections, of said memory cell.

* * * * *

UNITED STATES PATENT AND TRADEMARK OFFICE
CERTIFICATE OF CORRECTION

PATENT NO. : 4,580,245
DATED : April 1, 1986
INVENTOR(S) : Daniel H. Ziegler and Donald F. Fier It is certified that error appears in the above-identified patent and that said Letters Patent is hereby corrected as shown below:

IN THE PRINTED PATENT

Column 12, line 40, after "a" insert -- series N-type and -- .

Column 12, line 41, after "transistor," insert -- wherein said fifth transistor comprises a P-type transistor, -- .

Column 12, line 53, "signa" should be -- signal -- .

Signed and Sealed this

Fifth Day of August 1986

[SEAL]

Attest:

DONALD J. QUIGG

Attesting Officer

Commissioner of Patents and Trademarks